(12) United States Patent
Shimizu et al.

(10) Patent No.: US 6,743,841 B2
(45) Date of Patent: Jun. 1, 2004

(54) HEAT-RESISTANT COMPOSITION

(75) Inventors: Toshiyuki Shimizu, Ohtsu (JP); Yuji Tada, Tokushima (JP)

(73) Assignees: Toyo Boseki Kabushiki Kaisha, Osaka (JP); Otsuka Chemical Co., Ltd., Osaka (JP)

( * ) Notice: Subject to any disclaimer, the term of this patent is extended or adjusted under 35 U.S.C. 154(b) by 142 days.

(21) Appl. No.: 10/071,624

(22) Filed: Feb. 8, 2002

(65) Prior Publication Data

US 2002/0161077 A1 Oct. 31, 2002

(30) Foreign Application Priority Data

Feb. 9, 2001 (JP) .......................... 2001-034161

(51) Int. Cl.[7] .......................... C08K 5/51; C08K 15/04; C08K 15/08
(52) U.S. Cl. .................. 524/136; 524/138; 524/148; 428/416; 428/457; 525/450; 525/467
(58) Field of Search .................. 524/136, 138, 524/148; 428/416, 457; 525/450, 467

(56) References Cited

U.S. PATENT DOCUMENTS

| | | | |
|---|---|---|---|
| 3,890,092 | A | 6/1975 | Garner |
| 5,321,097 | A | 6/1994 | Kawaki et al. |
| 5,539,041 | A | 7/1996 | Arnold et al. |
| 5,972,807 | A | 10/1999 | Tani et al. |
| 6,518,336 | B1 * | 2/2003 | Yabuhara et al. ........... 524/116 |

FOREIGN PATENT DOCUMENTS

| | | |
|---|---|---|
| EP | 0 945 478 A1 | 9/1999 |
| EP | 1 164 170 A1 | 12/2001 |

OTHER PUBLICATIONS

Database WPI, Section Ch, Week 199521, Derwent Publications Ltd., London, GB, AN 1995–159151 (XP–002198214) (Mar. 28, 1995).
Abu–Shanab et al., "Polyphosphazene Toughened PMRtype Thermosets," retrieved from STN Database accession No. 125:277263 (XP–002198213) (1996).

* cited by examiner

Primary Examiner—Kriellion A. Sanders
(74) Attorney, Agent, or Firm—Leydig, Voit & Mayer, Ltd.

(57) ABSTRACT

A heat-resistant composition contains solvent-soluble polyimide resin (A) and a phosphazene compound (B) in relation to a polyimide resin composition having solubility in a low-boiling solvent, heat resistance, flame resistance, adhesiveness and mechanical properties. The said phosphazene compound (B) is a cyclic phenoxyphosphazene compound (B1) expressed in the following chemical formula (1):

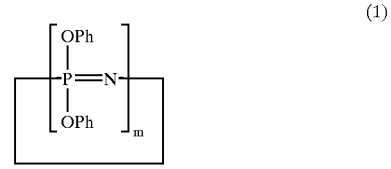

(1)

where m represents an integer of 3 to 25 and Ph represents a phenyl group.

39 Claims, No Drawings

HEAT-RESISTANT COMPOSITION

BACKGROUND OF THE INVENTION

1. Field of the Invention

The present invention relates to a heat-resistant composition having excellent flame resistance useful as an adhesive, a coating material or an ink.

2. Description of the Prior Art

Solvent-soluble polyimide having excellent heat resistance is utilized as a heat-resistant coating material or a heat-resistant adhesive, which is essential for manufacturing an electronic component or a printed wiring board.

In order to use such solvent-soluble polyimide, however, some problems must be solved. More specifically, the solvent-soluble polyimide must be improved in solubility in a low-boiling solvent, heat resistance and the like.

In relation to the improvement in solubility in a low-boiling point, general solvent-soluble polyimide is dissolved only in N-methyl-2-pyrolidone or sulfolane, which is a high-boiling solvent requiring drying at a high temperature to be removed in coating. This drying must industrially disadvantageously be performed under a nitrogen atmosphere, in order to suppress deterioration of the resin. If the solvent-soluble polyimide is used while the solvent still remains, the characteristics thereof etc. are reduced due to moisture adsorption.

In relation to the improvement in heat resistance, the aforementioned solvent-soluble polyimide is already completely rendered imidic to have thermoplasticity in general. However, the thermoplastic solvent-soluble polyimide tends to abruptly cause thermal deformation in a temperature region exceeding the glass-transition temperature (Tg). Thus, the glass-transition temperature of the employed polyimide must be sufficiently higher than the required heat resistance, leading to requirement for a material having higher heat resistance.

Some methods of solving the aforementioned problems are known in general. As to the improvement in solubility in a low-boiling solvent, for example, an alicyclic component or an aliphatic component is generally introduced into polyimide resin for imparting solubility in a low-boiling solvent, in order to attain milder drying conditions. In this method, however, heat resistance and flame resistance of the polyimide resin are disadvantageously reduced. As to the improvement in heat resistance, a stiffer component must be employed for imparting higher heat resistance. In this case, however, solvent solubility is reduced and hence it is difficult to compatibly improve the heat resistance and the solubility in a low-boiling solvent. While a cross-linkable component such as epoxy resin may be employed for improving the heat resistance, the cross-linkable component itself is inflammable and reduces the flame resistance of the polyimide resin composition. In order to compatibly improve the solubility in a low-boiling solvent and the heat resistance while maintaining flame resistance, therefore, the polyimide resin must be employed along with a flame retardant.

In relation to the flame retardant, a phosphorus compound such as phosphate or inorganic hydroxide such as aluminum hydroxide is known in general. However, the compound such as phosphate, generally having a low melting point and a low boiling point as well as low compatibility with polyimide resin, reduces adhesiveness of the polyimide resin due to exudation of the flame retardant. As to adhesiveness under a high temperature, it is known that the phosphorus compound is liquefied or vaporized to reduce adhesiveness particularly under a high temperature and after high-temperature treatment or cause blistering. On the other hand, the inorganic hydroxide must be mixed into the heat-resistant composition in a large quantity in order to impart sufficient flame resistance, leading to reduction of characteristics such as adhesiveness, flexibility and hygroscopicity.

As hereinabove described, there has been obtained no satisfactory halogen-free polyimide heat-resistant composition having solubility in a low-boiling solvent, heat resistance, flame resistance, adhesiveness and mechanical properties under the present circumstances.

SUMMARY OF THE INVENTION

In order to solve the aforementioned problems, an object of the present invention is to provide a halogen-free polyimide heat-resistant composition having solubility in a low-boiling solvent, heat resistance, flame resistance, adhesiveness and mechanical properties.

The heat-resistant composition according to the present invention contains solvent-soluble polyimide resin (A) and a phosphazene compound (B). The said phosphazene compound (B) includes at least either a cyclic phenoxyphosphazene compound (B1) expressed in the following chemical formula (1):

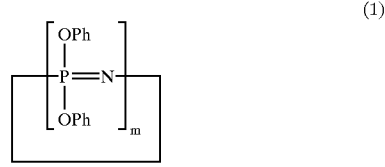

where m represents an integer of 3 to 25 and Ph represents a phenyl group, or a chain phenoxyphosphazene compound (B2) expressed in the following chemical formula (2):

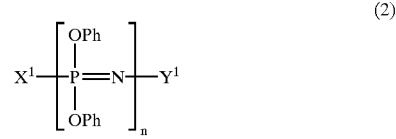

where $X^1$ represents group-N=P(OPh)$_3$ or group-N=P(O)OPh, $Y^1$ represents group-P(OPh)$_4$ or group-P(O)(OPh)$_2$, n represents an integer of 3 to 10,000 and Ph represents a phenyl group, or a cross-linked phenoxyphosphazene compound (B3) cross-linked by a cross-linking group including at least one of an o-phenylene group, an m-phenylene group, a p-phenylene group and a bisphenylene group expressed in the following chemical formula (3):

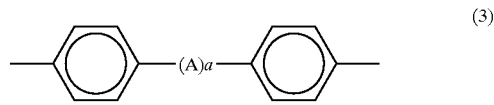

where A represents —C(CH$_3$)$_2$—, —SO$_2$—, —S— or —O— and a represents 0 or 1, with respect to the phosphazene compound including at least either the said cyclic phenoxyphosphazene compound (B1) or the said chain phenoxyphosphazene compound (B), so that the said cross-linking group intervenes between two oxygen atoms desorbed by the said phenyl group of the phosphazene compound and the phenyl group content is 50 to 99.9% with reference to the total number of phenyl groups contained in the said phosphazene compound including at least either the said cyclic phenoxyphosphazene compound (B1) or the said chain phenoxyphosphazene compound (B2) with no free hydroxyl groups in molecules.

The heat-resistant composition according to the present invention is characterized in that the said polyimide resin (A) is polyimide resin, containing a solvent solubility imparting component selected from at least one of an aliphatic compound component, an alicyclic compound component and an alkylene oxide adduct component of a bisphenol compound, soluble in a solvent containing a low-boiling solvent.

The heat-resistant composition according to the present invention can contain a reactive compound (C) selected from at least one of an epoxy compound, an acrylic compound and an isocyanate compound.

The heat-resistant component according to the present invention is characterized in that the said polyimide resin (A) is polyamide imide resin and the said reactive compound (C) is an epoxy compound.

The heat-resistant composition according to the present invention is characterized in that the said polyimide resin (A) is polyester imide resin and the said reactive compound (C) is an epoxy compound.

The heat-resistant composition according to the present invention is characterized in that the said polyimide resin (A) is polyether imide resin and the said reactive compound (C) is an epoxy compound.

The present invention is also directed to an adhesive for a printed wiring board employing the said heat-resistant composition.

The present invention is also directed to an adhesive sheet for a printed wiring board employing the said heat-resistant composition.

The present invention is also directed to a multilayer printed wiring board employing the said heat-resistant composition.

The present invention is also directed to a sealant for a printed wiring board employing the said heat-resistant composition.

The present invention is also directed to an insulating circuit protective film for a printed wiring board employing the said heat-resistant composition.

The present invention is also directed to a circuit protective agent employing the said heat-resistant composition.

The present invention is also directed to a cover-lay film employing the said heat-resistant composition.

The present invention is also directed to a cover ink employing the said heat-resistant composition.

The present invention is also directed to a substrate for a printed wiring board employing the said heat-resistant composition.

The present invention is also directed to a metal-clad laminate employing the said heat-resistant composition.

The present invention is also directed to a conductive paste for a printed wiring board employing the said heat-resistant composition.

The foregoing and other objects, features, aspects and advantages of the present invention will become more apparent from the following detailed description of the present invention.

DESCRIPTION OF THE PREFERRED EMBODIMENTS

The inventor has made deep study to newly recognize that a heat-resistant composition containing solvent-soluble polyimide resin (A) and a phosphazene compound (B), including at least either a cyclic phenoxyphosphazene compound (B1) expressed in the following chemical formula (1):

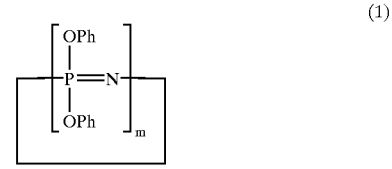

where m represents an integer of 3 to 25 and Ph represents a phenyl group, or a chain phenoxyphosphazene compound (B2) expressed in the following chemical formula (2):

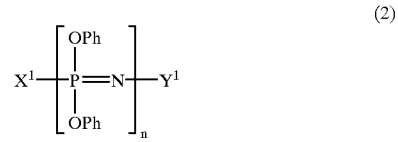

where $X^1$ represents group-$N=P(OPh)_3$ or group-$N=P(O)OPh$, $Y^1$ represents group-$P(OPh)_4$ or group-$P(O)(OPh)_2$, n represents an integer of 3 to 10,000 and Ph represents a phenyl group, or a cross-linked phenoxyphosphazene compound (B3) cross-linked by a cross-linking group including at least one of an o-phenylene group, an m-phenylene group, a p-phenylene group and a bisphenylene group expressed in the following chemical formula (3):

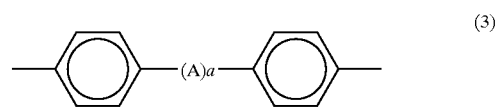

where A represents —$C(CH_3)_2$—, —$SO_2$—, —S— or —O— and a represents 0 or 1, with respect to the phosphazene compound including at least either the said cyclic phenoxyphosphazene compound (B1) or the said chain phenoxyphosphazene compound (B) so that the said cross-linking group intervenes between two oxygen atoms desorbed by the phenyl group of the phosphazene compound and the phenyl group content is 50 to 99.9% with reference to the total number of phenyl groups contained in the said phosphazene compound with no free hydroxyl groups in molecules is capable of balancing solvent solubility, heat resistance, flame resistance and adhesiveness, to complete the present invention on the basis of this new recognition.

In the cross-linked phenoxyphosphazene compound (B3) having the phenyl group content of 50 to 99.9% with reference to the total number of phenyl groups contained in the phosphazene compound including at least either the aforementioned cyclic phosphazene compound (B1) or the chain phenoxyphosphazene compound (B2), the phenyl group of the phosphazene compound including at least either the aforementioned cyclic phosphazene compound (B1) or the chain phenoxyphosphazene compound (B2) is desorbed and the cross-linking group intervenes between two oxygen atoms so that the phenyl group content in the cross-linked phenoxyphosphazene compound (B3) is 50 to 99.9% with reference to the total number of phenyl groups contained in the phosphazene compound including at least either the aforementioned cyclic phosphazene compound (B1) or the chain phenoxyphosphazene compound (B2). When a non-cross-linked phenoxyphosphazene compound is cross-linked, the number of phenyl groups contained in the cross-linked phenoxyphosphazene compound is reduced as compared with that in the non-cross-linked phenoxyphosphazene compound.

A phosphazene compound is generally known for an effect of imparting high flame resistance to polyimide resin. However, generally existing propoxyphosphazene or the like is liquefied and hence adhesiveness is so remarkably reduced after high-temperature treatment that the propoxyphosphazene or the like causes blistering or peeling when the polyimide composition is employed as an adhesive held between metal plates or the like in particular.

Polyimide Resin

The polyimide resin (A) employed for the heat-resistant composition according to the present invention, having an imide ring in the resin skeleton as a repeating unit, can be prepared from polyamide imide, polyester imide, polyether imide, maleimide or the like, in addition to polyimide.

The polyimide resin (A) according to the present invention can be prepared by reacting an acid component with an amine component by a general method such as an isocyanate method or an acid chloride method. While the isocyanate method can be carried out with an organic solvent such as an amide organic solvent such as N,N-dimethylformaldehyde, N,N-dimethylacetamide, N,N-diethylacetamide, N,N-dimethylmethoxyacetamide, N-methyl-2-pyrolidone or hexamethylphosphamide, a lactam organic solvent such as N-methylcaprolactam, a urea organic solvent such as 1,3-dimethyl-2-imidazolidinone or tetramethylurea, a hydrocarbon organic solvent such as 1,2-dimethoxyethane, 1-2-bis (2-methoxyethyl)ethane or bis [2-(2-methoxyethoxy) ethane], an ether organic solvent such as bis(2-methoxyethyl)ether, bis[2-(2-methoxyethoxy)ethyl]ether, 1,3-dioxane, 1,4-dioxane, tetrahydrofuran or diglyme, an ester organic solvent such as γ-butyrolactone, a pyridine organic solvent such as pyridine or picoline, a sulfur organic solvent such as dimethylsulfoxide, dimethylsulfone or sulfolane, a nitro organic solvent such as nitromethane, nitroethane or nitrobenzene or a nitrile organic solvent such as acetonitrile, the present invention is not restricted to this. The organic solvent can be employed as a simple substance or in the form of a mixture of at least two solvents.

The reaction temperature is preferably 50 to 220° C. in general. The reaction, which can be performed in a non-catalytic state, may be carried out under presence of a catalyst such as tertiary amine, an alkaline metal compound, an alkaline earth metal compound, a metal such as cobalt, titanium, tin or zinc or a metalloid compound, for example, for reaction between isocyanate and an active hydrogen compound.

In order to obtain polyamide imide or polyester imide as the polyimide resin, trimellitic anhydride must essentially be employed as an acid component.

In addition to trimellitic anhydride, a copolymerizable acid component can be selected from aliphatic or alicyclic dicarboxylic acid such as oxalic acid, malonic acid, succinic acid, adipic acid, sebacic acid, azelaic acid, dodecandionic acid, cyclohexane dicarboxylic acid, maleic acid, maleic anhydride, itaconic acid, itaconic anhydride, dimer acid or hydrogenated dimer acid, aromatic dicarboxylic acid such as terephthalic acid, isophthalic acid, naphthalene dicarboxylic acid, diphenylmethane-4,4-dicarboxylic acid, diphenylether-4,4-dicarboxylic acid, bis[(4-carboxy) phthalimide]-a,a'-methaxylene or 5-hydroxyisophthalic acid, butane-1,2,4-tricarboxylic acid, naphthalene-1,2,4-tricarboxylic acid or acid anhydride thereof, tetracarboxylic acid such as pyromellitic acid, benzophenone tetracarboxylic acid, benzene-1,2,3,4-tetracarboxylic acid, biphenyltetracarboxylic acid, naphthalene tetracarboxylic acid, perylene-3,4,9,10-tetracarboxylic acid, ethylene glycol bis (anhydrotrimellitate), propylene glycol bis (anhydrotrimellitate) or 3,3',4,4'-oxydiphthalic acid or dihydrate thereof, for example. The acid component can be employed as a simple substance or in the form of a mixture of at least two components.

As a diamine component, 4,4'-diaminodiphenylmethane, 4,4'-diaminodicyclohexylmethane, 1,4-bis(4-aminophenoxy)benzene, 1,3-bis(4-aminophenoxy)benzene, 1,3-bis(3-aminophenoxy)benzene, 2,2-bis[4-(4-aminophenoxy)phenyl]hexafluoropropane, 1,4-bis(4-aminophenoxy)diphenylether, 1,3-bis(4-aminophenoxy) diphenylether, 1,3-bis(3-aminophenoxy)diphenylether, 1,4-bis(4-aminophenoxy)diphenylpropane, 1,3-bis(4-aminophenoxy)diphenylpropane, 1,3-bis(3-aminophenoxy) diphenylpropane, bis[4-(4-aminophenoxy)phenyl]sulfone, bis[4-(3-aminophenoxy)phenyl]sulfone, bis[4-(2-aminophenoxy)phenyl]sulfone, 3,3'-diaminodiphenylsulfone, 4,4'-diaminodiphenylsulfone, 4,4'-[1,4-phenylenebis(1-methylethylidene)]bisaniline, 4,4'-[1,3-phenylenebis(1-methylethylidene)]bisaniline, 3,3'-[1,4-phenylenebis(1-methylethylidene)]bisaniline, 1,3-bis (aminomethyl)cyclohexane, 1,4-bis(aminomethyl) cyclohexane, m-phenylenediamine, p-phenylenediamine, oxydianiline, m-xylylenediamine, p-xylylenediamine, hexafluoroisopropylidenediamine, 1,4-naphthalenediamine, 1,5-naphthalenediamine, 2,6-naphthalenediamine, 2,7-naphthalenediamine, 2,2'-bis(4-aminophenyl) hexafluoropropane, 4,4'-diaminodiphenylether, 3,4'-diaminodiphenylether, 4,4'-diaminobenzophenone, sisophoronediamine, hexamethylenediamine, tetramethylenediamine, 5-amino-1-(4'-aminophenyl)-1,3,3'-trimethylindan, isopropylidenedianiline, 3,3'-diaminobenzophenone, 4,4'-diaminodicyclohexyl, 1,4-diaminocyclohexyl,o-tolidine, 2,4-tolylenediamine, 2,6-tolylenediamine, 4,4'-bis(4-aminophenoxy)biphenyl, 4,4'-diaminodiphenylsulfide, 3,3'-diaminodiphenylsulfide, 6-amino-1-(4'-aminophenyl)-1,3,3-trimethylindan or diisocyanate corresponding thereto can be polymerized as a simple substance or in the form of a mixture of at least two components, for example. According to the present invention, isophoronediamine, hexamethylenediamine, diaminodicyclohexylmethane or isocyanate corresponding thereto is preferably employed in consideration of solvent solubility and heat resistance.

In addition to the aforementioned compound, an alkylene oxide adduct such as aminobenzoic acid, hydroxybenzoic acid or bisphenol or a bifunctional compound such as phosphorus atom-containing polyol or phosphorus atom-containing dicarboxylic acid is also employable. This component is employed for imparting reactivity, adhesion and flame resistance. The content of this component, used in a range not reducing the characteristics of the polyimide resin employed in the present invention, is generally not more than 50 mole %, preferably not more than 30 mole % with respect to the total diamine component.

The optimum molecular weight of the heat-resistant composition according to the present invention, varying with compositions and application, is preferably within the range of 0.1 to 2.5 dl/g in inherent viscosity at 30° C. in N-methyl-2-pyrolidone.

The aforementioned polyimide resin (A) is polymerizable in a molten state, in place of polymerization in a solvent. In particular, polyetherimide or polyesterimide containing no aromatic amide bond and having no possibility of branching of amide bonds is suitable for molten polymerization. In relation to molten polymerization, polyesterimide can be obtained by copolymerizing an imide ring-containing compound prepared from diamine and polyvalent carboxylic acid with polyester. Copolymerization with polyester is enabled by employing imide ring-containing dicarboxylic acid or glycol as a general carboxylic acid or a general glycol component and performing polymerization with a well-known method. A well-known carboxylic acid component or glycol component, a well-known polymerization catalyst and well-known polymerization conditions can be employed.

The polyimide resin (A) employed for the heat-resistant composition according to the present invention preferably contains a solvent solubility imparting component selected from at least one of an aliphatic compound component, an alicyclic compound component and an alkylene oxide adduct component of a bisphenol compound, and is preferably soluble in a solvent containing a low-boiling solvent.

While at least one component is selected from the aforementioned aliphatic carboxylic acid, alicyclic carboxylic acid, aliphatic isocyanate and alicyclic isocyanate as the aliphatic compound component or the alicyclic compound component, the component must contain no component having a carbon number of not more than 4, and preferably contains no component having a carbon number of not more than 6, more preferably not more than 8.

When the same quantities of aliphatic dicarboxylic acid having a carbon number of 4 and that having a carbon number of 20 are copolymerized with aromatic polyimide, the average sequence length of an aromatic polyimide unit having high flame resistance is reduced to ⅕ in the former as compared with the latter. The aromatic polyimide unit having high flame resistance is hardly carbonized in combustion when the average sequence length is reduced, and hence the effect of imparting flame resistance attained by adding a flame retardant is reduced. Therefore, the component preferably contains no component having a carbon number of not more than 6. A preferable component is prepared from dimer acid, hydrogenated dimer acid, isophoronediamine, hexamethylenediamine, diaminodicyclohexylmethane or isocyanate corresponding thereto.

The alkylene oxide adduct of the bisphenol compound can be prepared from an ethylene oxide adduct such as bisphenol A, bisphenol F, bisphenol S or bisphenol or a propylene oxide adduct. The content of the alkylene oxide adduct, which is not particularly limited, is not more than 5 moles, preferably not more than 3 moles, more preferably not more than 2 moles on a single end on the average in consideration of thermal stability.

This component has a remarkable effect of improving solvent solubility and substantially hardly reduces heat resistance. The quantity of copolymerization of this component must be within the range of 1 to 100 mole % with respect to the total carboxylic acid component or the total amine component. Thus, solubility in an aromatic solvent, a ketone solvent or an ether solvent is improved in particular.

While the polyimide resin (A) employed for the heat-resistant composition according to the present invention may be either polyimide already rendered imidic or polyamic acid rendered imidic in hardening, it is preferable to employ highly stable polyimide already rendered imidic hardly causing reaction in compounding.

The polyimide resin (A) employed for the heat-resistant composition according to the present invention may contain a functional group such as a carboxyl group, an amino group, a hydroxyl group, an isocyanate group or an unsaturated bond, for example, having reactivity with a reactive compound described later.

Phosphazene Compound

The phenoxyphosphazene compound (B) in the heat-resistant composition according to the present invention is not particularly limited but can be prepared from a well-known one so far as the same is obtained by reaction between a dichlorophosphazene compound and phenolic alkaline metal salt. More specifically, this phenoxyphosphazene compound may be:

(1) a cyclic phenoxyphosphazene compound (hereinafter referred to as "cyclic phenoxyphosphazene compound (B1)") expressed in the following chemical formula (1):

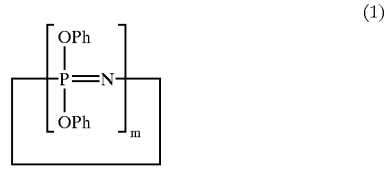

where m represents an integer of 3 to 25 and Ph represents a phenyl group, (2) a chain phenoxyphosphazene compound (hereinafter referred to as "chain phenoxyphosphazene compound (B2)") expressed in the following chemical formula (2):

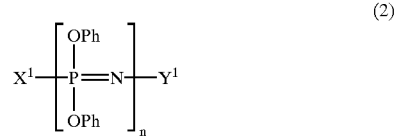

where $X^1$ represents group-N=P(OPh)$_3$ or group-N=P(O)OPh, $Y^1$ represents group-P(OPh)$_4$ or group-P(O)(OPh)$_2$, n represents an integer of 3 to 10,000 and Ph represents a phenyl group, or (3) a cross-linked phenoxyphosphazene compound (hereinafter referred to as "cross-linked phenoxyphosphazene compound (B3)") prepared by cross-linking the phosphazene compound of at least either the cyclic phenoxyphosphazene compound (B1) or the chain phenoxyphosphazene compound (B2) with at least one cross-linking group selected from an o-phenylene group, an m-phenylene group, a p-phenylene group and a bisphenylene group expressed in the following chemical formula (3):

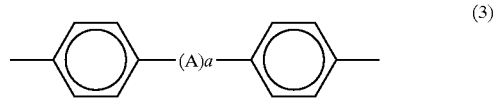

where A represents —C(CH$_3$)$_2$—, —SO$_2$—, —S— or —O— and a represents 0 or 1, so that (a) the cross-linking group intervenes between two oxygen atoms desorbed by the phenyl group of the phosphazene compound and (b) the phenyl group content is 50 to 99.9% with reference to the total number of phenyl groups contained in the phosphazene compound including at least either the phenoxyphosphazene compound (B1) or (B2), (c) with no free hydroxyl groups in molecules.

The end groups $X^1$ and $Y^1$ in the chemical formula (2) vary with reaction conditions or the like such that the end groups $X^1$ and $Y^1$ have structures of group-N=P(OPh)$_3$ and group-P(OPh)$_4$ respectively under mild nonaqueous reaction conditions or the end groups $X^1$ and $Y^1$ have structures of group-N=P(O)OPh and group-P(O) (OPh)$_2$ in addition to the structures of group-N=P(OPh)$_3$ and group-P(OPh)$_4$ respectively under such reaction conditions that moisture or an-alkaline metal hydroxide is present in the reaction system or under severe reaction conditions causing transition, for example.

Throughout the specification, the wording "with no free hydroxyl groups in molecules" indicates that the quantity of free hydroxyl groups is below the limit of detection when determined by acetylation with acetic anhydride and pyridine described in Analytical Chemistry Handbook (revised third edition, edited by the Japan Society for Analytical Chemistry, Maruzen Co., Ltd., 1981) p. 353. More specifically, the limit of detection, which is the hydroxyl group equivalent per 1 g of a sample (the cross-linked phenoxyphosphazene compound according to the present invention), is not more than $1 \times 10^{-6}$ hydroxyl group eq./g. While the quantity of hydroxyl groups of remaining raw phenol is also added when the cross-linked phenoxyphosphazene compound according to the present invention is analyzed by the aforementioned acetylation, raw phenol can be determined by high-speed liquid chromatography and hence only free hydroxyl groups contained in the cross-linked phenoxyphosphazene compound can be determined.

The cross-linked phenoxyphosphazene compound is obtained by cross-linking the phosphazene compound including at least either the cyclic phenoxyphosphazene compound or the chain phenoxyphosphazene compound with the compound having two phenolic hydroxyl groups, and hence it is assumed that one of the two phenolic hydroxyl groups remains unreacted in preparation. The wording "with no free hydroxyl groups in molecules" stands for absence of such phenolic hydroxyl group remaining unreacted.

The cyclic phenoxyphosphazene compound (B1) or the chain phenoxyphosphazene compound (B2) is prepared by reacting a dichlrophosphazene compound with alkaline metal phenolate.

The dichlorophosphazene compound can be prepared from a well-known one such as a cyclic dichlorophosphazene compound (hereinafter referred to as "cyclic dichlorophosphazene compound (4)") expressed in the following chemical formula:

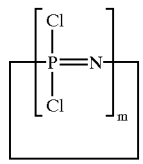

(4)

where m represents an integer of 3 to 25, or a cyclic dichlorophosphazene compound (hereinafter referred to as "cyclic dichlorophosphazene compound (5)") expressed in the following chemical formula:

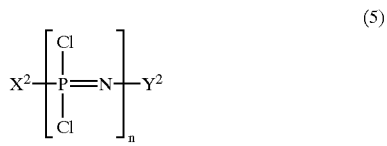

(5)

where $X_2$ represents group-N=PCl$_3$ or group-N=P(O)Cl, $Y_2$ represents group-P(Cl)$_4$ or group-P(O)Cl$_2$ and n represents an integer of 3 to 10,000. The dichlorophosphazene compound can be employed as a single substance or in combination of at least two compounds. Cyclic and chain compounds may be combined with each other. The dichlorophosphazene compound can be prepared according to a well-known method described in "Phosphorus-Nitrogen Compounds" by H. R. Allcock, Academic Press (1972) or "Inorganic Polymers" by J. E. Mark, H. R. Allcock and R. West, Prentice-Hall International Inc. (1992), for example. For example, the cyclic dichlorophosphazene compound (4) having the integer m of 3 to 25 or the chain dichlorophosphazene compound (5) having the integer n of 3 to 25 can be prepared by reacting ammonium chloride with phosphorus pentachloride (or with phosphorus trichloride and chlorine) in chlorobenzene or tetrachloroethane at about 120 to 130° C. and dehydrochlorinating the same. The dichlorophosphazene compound (dichlorophosphazene oligomer) is generally obtained as a mixture. A cyclic dichlorophosphazene compound such as hexachlorotriphosphazene, octachlorocyclotetraphosphazene or decachlorocyclopentaphosphazene is obtained from the mixture of the cyclic or chain dichlorophosphazene oligomer obtained in the aforementioned manner by distillation or recrystallization. The chain dichlorophosphazene compound (5) having the integer n of 25 to 10,000 can be prepared by heating hexachlorocyclotriphosphazene to 220 to 250° C. and performing ring-opening polymerization. The cyclic and chain dichlorophosphazene compounds may be employed in a mixed state or independently of each other.

Known metal phenolate such as alkaline metal phenolate (hereinafter referred to as "alkaline metal phenolate (6)") expressed in the following chemical formula:

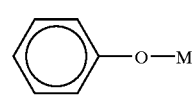

(6)

where M represents an alkaline metal, can be employed, for example. The alkaline metal M in the chemical formula (6) can be prepared from sodium, potassium or lithium. More specifically, the alkaline metal phenolate (6) can be prepared from sodium phenolate, potassium phenolate or lithium phenolate, for example. The alkaline metal phenolate can be used as a simple substance or in combination of at least two types.

The cross-linked phenoxyphosphazene compound (B3) is prepared by mixing the alkaline metal phenolate and diphenolate into a dichlorophosphazene compound and reacting the same (first step) and further reacting the obtained compound with the alkaline metal phenolate (second step), for example.

The dichlorophosphazene compound can be prepared from that similar to the above. At least two dichlorophosphazene compounds may be mixed with each other, or cyclic and chain compounds may be combined with each other. The alkaline metal phenolate can also be prepared from that similar to the above, and at least two types may be combined with each other.

Well-known diphenolate such as o-, m- or p-exchange alkaline metal diphenolate (hereinafter referred to as "alkaline metal diphenolate (7)") expressed in the following chemical formula:

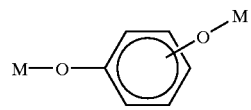

(7)

where M represents an alkaline metal, can be employed, for example, or alkaline metal diphenolate (hereinafter referred to as "alkaline metal diphenolate (8)") expressed in the following chemical formula:

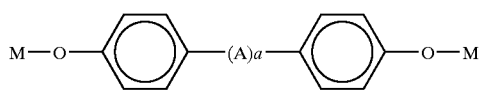

(8)

where A represents —C(CH$_3$)$_2$—, —SO$_2$—, —S— or —O—, a represents 0 or 1 and M represents an alkaline metal, can be employed, for example. In the alkaline metal diphenolate (7), the two groups —O—M (M: alkaline metal) may be in ortho, meta or para positional relation. More specifically, the alkaline metal diphenolate (7) can be prepared from alkaline metal salt such as resorcinol, hydroquinone or catechol, for example. In particular, sodium salt or lithium salt is preferable. The alkaline metal diphenolate (7) can be employed as a simple substance or in combination of at least two types. The alkaline metal diphenolate (8) can be prepared from alkaline metal salt such as 4,4'-isopropyridenediphenol (bisphenol A), 4,4'-sulfonyldiphenol (bisphenol S), 4,4'-thiodiphenol, 4,4'-oxydiphenol or 4,4'-diphenol, for example. In particular, sodium salt or lithium salt is preferable. The alkaline metal diphenolate (8) can be used as a simple substance or in combination of at least two types. The alkaline metal diphenolate (7) and the alkaline metal diphenolate (8) may be individually used or combined with each other.

In the first step of preparing the cross-linked phenoxyphosphazene compound (B3), the quantities of the alkaline metal phenolate and the alkaline metal diphenolate are preferably so adjusted that chlorine atoms contained in the dichlorophosphazene compound are not entirely consumed by reaction with the alkaline metal phenolate and the alkaline metal diphenolate, i.e., so that the chlorine atoms contained in the dichlorophosphazene compound still remain upon reaction with the alkaline metal phenolate and the alkaline metal diphenolate. Thus, both —O—M groups (M: alkaline metal) of the alkaline metal diphenolate are bonded with phosphorus atoms contained in the dichlorophosphazene compound. In the first step, the quantities of the alkaline metal phenolate and the alkaline metal diphenolate may be set to about 0.05 to 0.9 eq., preferably about 0.1 to 0.8 eq. in total with reference to the chlorinity of the dichlorophosphazene compound, in general.

In the second step, the quantity of the alkaline metal phenolate is preferably so adjusted that chlorine atoms contained in the compound formed through the aforementioned first step are entirely consumed by reaction with the alkaline metal phenolate. The quantity of the alkaline metal phenolate may be set to about 1 to 1.5 eq., preferably about 1 to 1.2 eq. with reference to the chlorinity of the dichlorophosphazene compound, in general.

The ratio (alkaline metal diphenolate/alkaline metal phenolate, molar ratio) of the alkaline metal phenolate (total quantity in the first and second steps) and the alkaline metal diphenolate may be set to about 1/200 to 1/4, preferably 1/20 to 1/6 in general.

Reaction in each of the first and second steps is carried out in the temperature range of the room temperature to about 150° C., preferably about 80 to 140° C., and generally ended in about 1 to 12 hours, preferably in about 3 to 7 hours. The reaction in each of the first and second steps is performed in an organic solvent such as aromatic hydrocarbon such as benzene, toluene or xylene or halogenated aromatic hydrocarbon such as monochlorobenzene or dichlorobenzene in general.

The content of phenyl groups in the cross-linked phenoxyphosphazene compound (B3) is 50 to 99.9%, preferably 70 to 90% with reference to the total number of phenyl groups contained in the phosphazene compound including at least either the cyclic phenoxyphosphazene compound (B1) or the chain phenoxyphosphazene compound (B2).

Among the aforementioned phenoxyphosphazene compounds, the cross-linked phenoxyphosphazene compound (B3) can be preferably used. A single phenoxyphosphazene compound or a mixture of at least two phenoxyphosphazene compounds can be employed for the present invention.

The loading is preferably in the range of 0.1 to 50% with reference to the whole composition. The effect of imparting flame resistance is reduced if the loading is less than 0.1%, while reduction of adhesiveness or mechanical properties is observed if the loading exceeds 50%.

Solvent and Low-Boiling Solvent

While it has been first described that the aforementioned reaction solvent, generally having a high boiling point, may require a high temperature for removal and cause a problem in preparation steps and characteristics, the present invention is characterized in that polyimide resin is dissolved in a solvent containing a low-boiling solvent in order to solve this problem.

The low-boiling solvent employed in the present invention can be prepared from ketone, alcohol, ether, ester, aromatic, amine or amide having a boiling point of not more than 170° C., preferably not more than 160° C. For example, glycol ether such as acetone, methyl ethyl ketone, methyl isobutyl ketone, cyclopentanone, cyclohexanone, methanol, ethanol, isopropyl alcohol, butanol, diethylether, tetrahydrofuran, dioxane or ethylene glycol dimethyl ether, propylene glycol ether, ethyl acetate, toluene, xylene, triethylamine, dimethylformamide or dimethylacetamide can be employed. The polyimide resin for the heat-resistant composition according to the present invention must be soluble in a solvent containing at least 30 mass % of the low-boiling solvent. The solubility can be evaluated from transparency of a solution.

While a solution of the polyimide resin employed in the present invention can be diluted with the aforementioned solution containing the low-boiling solvent after completion of polymerization, only the resin component may alternatively be separated by reprecipitation or drying to be re-dissolved in the solvent containing the low-boiling solvent. A solution containing no high-boiling solvent can be obtained by this method, for obtaining a polyimide resin solution having excellent drying characteristics.

Reactive Compound

The reactive compound (C) used in the present invention can be employed from any compound such as an epoxy compound, an unsaturated compound or an isocyanate compound.

While the epoxy compound can be prepared from polyglycidyl ether or polyglycidyl ester having a molecular weight of 300 to 5000, the main component must be prepared from an epoxy compound having a molecular weight of 1000 to 2000. The epoxy compound can be prepared from diglycidyl ether of bisphenol A or oligomer thereof, diglycidyl ether of bisphenol F or oligomer thereof, diglycidyl ether of bisphenol S or oligomer thereof, diglycidyl ether of hydrogenated bisphenol A or oligomer thereof, diglycidyl ether of an alkylene oxide adduct of a bisphenol compound, diglycidyl orthophthalate, diglycidyl isophthalate, diglycidyl terephthalate, p-diglycidyl hydroxybenzoate, diglycidyl tetrahydrophthalate, diglycidyl hexahydrophthalate, diglycidyl succinate, diglycidyl adipate, diglycidyl sebacate, ethylene glycol diglycidyl ether, propylene glycol diglycidyl ether, 1,4-butanediol diglycidyl ether, 1,6-hexanediol diglycidyl ether, neopentyl glycol diglycidyl ether or polyalkylene glycol diglycidyl ether, triglycidyl trimellitate, triglycidyl isocyanurate, 1,4-diglycidyl oxybenzene, diglycidyl propylene urea, glycerol triglycidyl ether, trimethylol propane triglycidyl ether, pentaerythritol triglycidyl ether, sorbitol tetraglycidyl ether, triglycidyl tris(2-hydroxyethyl)isocyanurate, triglycidyl ether of a glycerol alkylene oxide adduct, polyglycidyl ether of diaminodiphenylmethane, N,N-diglycidylamino-1,3-glycidyl phenyl ether, biphenyl epoxy resin, dicyclopentadiene epoxy resin, diphenyl ether epoxy resin, novolac epoxy resin, dicyclopentadiene phenolic epoxy resin, naphthalene epoxy resin, amine epoxy resin, alicyclic diepoxy acetal, alicyclic diepoxy adipate, alicyclic diepoxy carboxylate or vinylcyclohexene dioxide. A preferable epoxy compound can be prepared from diglycidyl ether of bisphenol, cresol or phenol novolac epoxy resin or polyglycidyl ether of diamino diphenyl methane.

While the unsaturated compound can be prepared from a vinyl compound such as (meth)acrylic ester or styrene, vinyl ester such as vinyl acetate, vinyl ether, (meth)acrylamid or an allyl compound, a compound having a low boiling point is unpreferably volatilized at the setting temperature and hence a compound having a sufficiently high boiling point is preferable. A preferable unsaturated compound can be prepared from ester of (meth)acrylic acid and alcohol having a boiling point of at least 100° C., (meth)acrylamid or a vinyl compound. The unsaturated compound can be used as a simple substance or in the form of a mixture of at least two types.

The isocyanate compound can be prepared from a low-or-high-molecular compound such as aromatic or aliphatic diisocyanate or at least trivalent polyisocyanate. For example, a terminal isocyanate group-containing compound can be obtained by reacting tetramethylene diisocyanate, hexamethylene diisocyanate, toluene diisocyanate, diphenylmethane diisocyanate, hydrogenated diphenylmethane diisocyanate, xylylene diisocyanate, hydrogenated xylylene diisocyanate, isophorone diisocyanate or trimer of such an isocyanate compound and an excess of the isocyanate compound with a low-molecular hydrocarbon compound such as ethylene glycol, propylene glycol, trimethylol propane, glycerin, sorbitol, ethylenediamine, monoethanolamine, diethanolamine or triethanolamine or a high-molecular hydrocarbon compound such as polyester polyol, polyether polyol or polyamide. An isocyanate compound blocked with any compound can also be employed. The isocyanate compound can be used as a simple substance or in the form of a mixture of at least two isocyanate compounds.

The reactive compound employed for not reducing the glass-transition temperature after hardening is preferably prepared from epoxy resin, particularly from epoxy resin mainly composed of novolac epoxy resin.

Compounding

According to the present invention, the polyimide resin (A), the phosphazene compound (B) and the like can be dissolved in a common solvent for preparing a coating material, and a well-known solvent for polyimide resin is employable. When the polyimide resin is dissolved in the reactive compound, the reactive compound can be used as the solvent. The solvent can be prepared from an organic solvent such as aromatic hydrocarbon, ketone, ester, ether (cyclic ether or glycol ether), N-exchange amide, alcohol, carboxylic acid, amine or a chlorine solvent, water or a mixture of at least two of these materials.

When the reactive compound (C) is employed, a hardener therefor can be added. While an epoxy compound can be used with no addition of a hardener, the hardener is preferably added. The hardener for the epoxy compound can be prepared from amine, mercaptan, an acid compound, acid anhydride, phenol or isocyanate, for example. Dicyandiamide, an amine adduct, sulfonium salt or imidazol can also be used as a latent hardener, in the form of a simple substance or a mixture of at least two types. While the loading or the like can be set on the basis of well-known formulation, the content of the hardener is properly set to 0.1 to 50 parts by weight with respect to the reactive compound. When a latent hardener is employed, can-stability or the like is disadvantageously reduced due to the presence of the solvent in the composition. Therefore, the curable composition according to the present invention is preferably prepared as a solventless type or a poor solvent for the latent hardener is preferably added to the solvent for the curable composition when the latent hardener is employed.

When the reactive compound is an unsaturated compound, a polymerization initiator generating radicals by heat is necessary. The polymerization initiator can be prepared from peroxide, an azo compound, persulfate or a redox initiator. The polymerization initiator can be employed as a simple substance or in the form of a mixture of at least two initiators.

When the reactive compound is an isocyanate compound, amine or polyol can be employed. The isocyanate compound can be employed as a simple substance or in the form of a mixture of a least two compounds.

The heat-resistance composition according to the present invention is preferably prepared by combining polyamide imide and a phosphazene compound along with one or at least two reactive compounds at need, polyester imide and a phosphazene compound along with one or at least two reactive compounds at need, polyether imide and a phosphazene compound along with one or at least two reactive compounds at need or polyimide and a phosphazene compound along one or at least two reactive compounds at need, particularly preferably by combining polyamide imide and a phosphazene compound along an epoxy compound at need, polyester imide and a phosphazene compound along with an epoxy compound at need or polyamide imide and a phosphazene compound along with an unsaturated compound at need.

The composition according to the present invention is provided with high flame resistance due to the addition of the phosphazene compound to be applicable to a field requiring high flame resistance as such, an additive such as an inorganic/organic compound such as a hardener, while a hardener, a flowable modifier, inorganic powder such as colloidal silica, a flame retardant, a pigment, a dye or an anti-foaming agent may be mixed thereto. The hardener can be prepared from phenol formaldehyde resin, amino resin or a multifunctional aziridine compound. A hardener or an accelerator can be combined with such a cross-linking agent. While the flame retardant can be prepared from a well-known one such as a halogen compound, a phosphorus compound, phosphoric ester, a silicone flame retardant, inorganic hydroxide, polyphosphoric acid or ammonium salt thereof or phosphorus atom-containing epoxy resin, no halogen compound is preferably used in consideration of the object of the present invention. The flame resistance of the composition can be further improved by adding a small quantity of phosphorus compound other than the phosphazene compound.

In addition, any reactive compound having flame resistance is employable. While halogenated epoxy rein, phosphorus polyol (e.g., Exdit OP550 by Clariant), phosphorus epoxy, phenolic resin containing triazine rings or isocyanurate rings or epoxy resin can be employed, no halogen compound is preferably employed in consideration of the object of the present invention. When the reactive compound is not epoxy resin, a compound according to the structure of the aforementioned reactive flame retardant can be employed.

The heat-resistant composition according to the present invention, having excellent heat resistance, solvent solubility, flame resistance and adhesiveness, can be preferably employed as a material for a printed wiring board, for contributing to reduction of the manufacturing cost and improvement of the quality. More specifically, the inventive heat-resistant composition is applicable to an adhesive for a printed wiring board, an adhesive sheet for a printed wiring board, a sealant for a printed wiring board, an insulating circuit protective film for a printed wiring board, a circuit protective agent, a cover-lay film, a cover ink, a conductive paste for a printed wiring board, a substrate for a printed wiring board, a metal-clad laminate or a multilayer printed wiring board, for example, as well known in the art.

An adhesive sheet provided with a base is obtained by applying the heat-resistant composition according to the present invention to a base film of PET or the like and thereafter drying the same. Alternatively, the heat-resistant composition may be wound while separating the base of PET or the like, for obtaining an adhesive sheet having no base. A metal-clad laminate can be obtained by bonding the aforementioned sheet of the heat-resistant composition to a copper foil member, or directly coating a metal foil member with the heat-resistant composition and drying the same. A material for a multilayer printed wiring board can be obtained by holding the aforementioned adhesive sheet between a plurality of printed wiring boards or coating a printed wiring board with the heat-resistant composition according to the present invention, drying the same and bonding another printed wiring board thereto. A circuit-protective coating material can be obtained by bonding the aforementioned adhesive sheet as a covering film or directly coating a circuit with the heat-resistant composition according to the present invention. When the heat-resistant composition according to the present invention is impregnated in nonwoven fabric, mechanical strength etc. of the adhesive sheet can be improved. The heat-resistant composition according to the present invention can be employed as the material for various types of printed wiring boards such as a flexible printed wiring board, in addition to a hard substrate.

The heat-resistant composition according to the present invention is excellent in coating suitability, migration resistance etc. in addition to general electric characteristics, and can be preferably applied to an insulating protective film for a circuit or the like.

The heat-resistant composition according to the present invention can be mixed with another resin. An adhesive, a coating material or an ink based on the heat-resistant composition according to the present invention has applicability to any printing such as dip coating, brush coating, roll coating, spraying, gravure coating, extrusion, doctor blade coating or Commer coating.

EXAMPLES

While the present invention is now described in more detail with reference to Examples, the present invention is not restricted to these Examples. In the following description, the term "parts" stands for parts by weight, and the term "%" stands for mass percent. Respective items were measured according to the following methods:

(1) Solvent Solubility

Polyimide resin was dissolved in dimethylacetamide so that the solid concentration was 25%, and solubility was determined from transparency of the solution.

(2) Inherent Viscosity 0.1 g of polyimide resin was dissolved in 20 cc of N-methyl-2-pyrolidone for measuring inherent viscosity at 30° C.

(3) Glass Transition Temperature (Tg)

The glass transition temperature was measured by TMA tensile measurement with a load of 1 g, a sample size of 5 by 20 mm and a temperature rise rate of 10° C./min.

A sample film was prepared by applying a resin composition to a PET film so that the thickness was 50 $\mu$m in a dried state and drying the same at 100° C. for 10 minutes. The dried coating was separated from the PET film and dried at a temperature of 200° C. under decompression (not more than 10 mmHg) for two hours, for preparing the sample.

(4) Adhesiveness

A resin composition was applied to a polyimide film (Kapton by Toray Industries, Inc., 35 $\mu$m) so that the thickness was 5 $\mu$m in a dried state, and dried at a temperature of 165° C. under decompression for two hours. Electrolytic copper foil was superposed thereon and pressed with a press at a temperature of 300° C. under a point pressure of 20 kgf/cm$^2$ for three minutes. After this pressing, heat treatment was performed at 220° C. for one hour. Thereafter a polyimide film surface of a substance cut into a width of 1 cm was fixed to a jig, and adhesive strength of the copper foil to the polyimide film was measured with a tensile tester (180° peeling at a peel rate of 5 cm/min.)

(5) Adhesion

A resin composition was applied to an aluminum plate (250 $\mu$m in thickness) so that the thickness was 30 $\mu$m in a dried state, dried at a temperature of 100° C. for 10 minutes, and thereafter further dried at a temperature of 250° C. under decompression for one hour. Adhesion of the obtained substance to a coating base was evaluated by a method according to ASTM D-3369.

(6) Evaluation of Flame Resistance

A sample film was prepared by a method similar to that for preparing the sample for measurement of the glass transition temperature. Flame resistance of this sample was evaluated by a method according to UL94.

(6) Heat Resistance

The aforementioned sample for evaluation of adhesion was dipped in solder held at 300° C. for 30 seconds, for evaluating change in appearance and reduction of adhesive strength.

Exemplary Polyimide Resin (A-1)

96.6 g of trimellitic anhydride, 62.6g of diphenylmethane diisocyanate, 65.5 g of hydrogenated diphenylmethane diisocyanate, 0.44 g of sodium methoxide and 200 g of N-methyl-2-pyrolidone were introduced into a reaction vessel, stirred and heated to a temperature of 150° C. in about 30 minutes. Thereafter the mixture was stirred at a temperature of 150° C. for five hours, and diluted with 400 g of N-methyl-2-pyrolidone. The mixture was cooled to a temperature of not more than 50° C., and thereafter reprecipitated in methanol to be dried under decompression, for obtaining polyimide resin (A-1). The obtained resin exhibited inherent viscosity of 0.55 and a glass transition temperature of 250° C. with excellent solvent solubility.

Exemplary Polyimide Resin (A-2)

76.8 g of trimellitic anhydride, 41 g of a silicone compound having carboxylic acid on both ends, 62.5 g of diphenylmethane diisocyanate, 55.6 g of isophorone diisocyanate, 0.44 g of potassium fluoride and 200 g of γ-butyrolactone were introduced into a reaction vessel, stirred and heated to a temperature of 190° C. in two hours. Thereafter the mixture was stirred at a temperature of 190° C. for two hours, thereafter cooled to a temperature of 150° C. and diluted with 400 g of N-methyl-2-pyrolidone. The mixture was cooled to a temperature or not more than 50° C. and reprecipitated with methanol to be dried under decompression, for obtaining polyimide resin (A-2). The obtained resin exhibited inherent viscosity of 0.45 and a glass transition temperature of 250° C. with excellent solvent solubility.

Exemplary Polyimide Resin (A-3)

76.8 g of trimellitic anhydride, 128.8 g of diphenylmethane diisocyanate, 57.6 g of hydrogenated dimer acid and 250 g of dimethylacetamide (DMAc) were introduced into a reaction vessel and stirred to be reacted at a temperature of 120° C. for four hours. Thereafter the mixture was cooled to the room temperature and diluted with DMAc so that the solid concentration was 25%, for obtaining a DMAc solution of polyimide resin (A-3) having solid concentration of 25%. The obtained resin exhibited inherent viscosity of 0.40 and a glass transition temperature of 250° C. with excellent solvent solubility.

Exemplary Polyimide Resin (A-4)

96.6 g of trimellitic anhydride, 62.6 g of diphenylmethane diisocyanate, 67.8 g of bitolylene diisocyanate, 0.44 g of potassium fluoride and 200 g of N-methyl-2-pyrolidone were introduced into a reaction vessel, stirred and heated to a temperature of 150° C. in about 30 minutes. Thereafter the mixture was stirred at a temperature of 150° C. for five hours, and diluted with 400 g of N-methyl-2-pyrolidone. The mixture was cooled to a temperature of not more than 50° C. and thereafter reprecipitated with methanol to be dried under decompression, for obtaining polyimide resin (A-4). The obtained resin exhibited inherent viscosity of 0.50 and a glass transition temperature of 300° C. with excellent solution solubility.

In the following description, "—Ph" denotes a phenyl group and "—Ph—" denotes a phenylene group.

Exemplary Phenoxyphosphazene Compound (B3-1) Having a Cross-Linked Structure with Paraphenylene A mixture of 103.5 g (1.1 moles) of phenol, 44.0 g (1.1 moles) of sodium hydroxide, 50 g of water and 500 ml of toluene was heated/refluxed and only water was removed from the system, for preparing a toluene solution of sodium phenolate.

A mixture of 16.5 g (0.15 moles) of hydroquinone, 94.1 g (1.0 mole) of phenol, 31.1 g (1.3 moles) of lithium hydroxide, 52 g of water and 600 ml of toluene was introduced into a four-necked flask of 2 l in parallel with the aforementioned reaction and heated/refluxed while removing only water from the system, thereby preparing a toluene solution of hydroquinone and lithium salt of phenol. 580 g of a 20% chlorobenzene solution containing 1.0 unit mole (115.9 g) of dichlorophosphazene oligomer (a mixture of 62% of trimer, 12% of tetramer, 11% of pentamer and hexamer, 3% of heptamer and 12% of at least octamer) was dropped into this toluene solution under stirring at a temperature of not more than 30° C., and thereafter stirred at a temperature of 110° C. for three hours. The previously prepared toluene solution of sodium phenolate was added under stirring, and thereafter reaction was continued at a temperature of 110° C. for four hours.

After completion of reaction, the reaction mixture was washed three times with 1.0 l of a 3% sodium hydroxide aqueous solution, thereafter washed three times with 1.0 l of water, and thereafter an organic layer was concentrated under decompression. The obtained product was heated/vacuum-dried at a temperature of 80° C. for 11 hours under a pressure of not more than 3 mmHg, for obtaining 211 g of pale-yellow powder.

The cross-linked phenoxyphosphazene compound obtained in the aforementioned manner exhibited hydrolytic chlorine of 0.04% and weight-average molecular weight (Mw) of 1080 in terms of polystyrene (according to GPC analysis), and the composition of the final product was [N=P(—O—p—Ph—O—)$_{0.15}$(—O—Ph)$_{1.7}$] from a phosphorus content and a CHN elemental analysis value. The weight-average molecular weight (Mw) was 1100 in terms of polystyrene (according to GPC analysis), no clear melting point was exhibited in TG/DTA analysis, the kick-off temperature was 306° C., and a 5% weight reduction temperature was 311° C. Residual hydroxy groups were determined by acetylation, to obtain a limit of detection of not more than $1 \times 10^{-6}$ eq./g as a hydroxy equivalent per 1 g of the sample. A phosphazene compound (B3-1) was thus obtained.

Exemplary Phenoxyphosphazene Compound (B3-2) Having a Cross-Linked Structure by 2,2-bis(p-oxyphenyl) isopropyridene group 65.9 g (0.7 moles) of phenol and 500 ml of toluene were introduced into a four-necked flask of 1 l and stirred for finely cutting and introducing 0.65 gram atoms (14.9 g) of metallic sodium while keeping an internal liquid temperature at 25° C. Thereafter stirring was continued at a temperature of 77 to 113° C. for eight hours until metallic sodium completely disappeared.

In parallel with the aforementioned reaction, 0.25 moles (57.1 g) of bisphenol A, 1.1 moles (103.5 g) of phenol and 800 ml of tetrahydrofuran (THF) were introduced into a four-necked flask of 3 l and stirred for finely cutting and introducing 1.6 gram atoms (11.1 g) of metallic lithium while keeping an internal liquid temperature at 25° C. Thereafter stirring was continued at a temperature of 61 to 68° C. for eight hours until the metallic lithium completely disappeared. 1.0 mole (115.9 g) of dichlorophosphazene oligomer (313 g of a chlorobenzene solution of a mixture of 75% of trimer, 17% of tetramer, 6% of pentamer and hexamer, 1% of heptamer and 1% of at least octamer having concentration of 37%) was dropped into this slurry solution for one hour under stirring while keeping the internal liquid temperature not more than 20° C. and thereafter reacted at a temperature of 80° C. for two hours. Then, a separately prepared sodium phenolate solution was added to the mixture for one hour while keeping the internal liquid temperature at 20° C., and thereafter reacted at a temperature of 80° C. for five hours.

After completion of reaction, the reaction product was concentrated, THF was removed and 1 l of toluene was newly added thereto. This toluene solution was washed three times with 1 l of 2% NAOH and thereafter washed three times with 1 l of water, and an organic layer was concentrated under decompression. The obtained product was heated/vacuum-dried at a temperature of 80° C. for 11 hours under a pressure of 3 mmHg, for obtaining 229 g of white powder.

The cross-linked phenoxyphosphazene compound obtained in the aforementioned manner exhibited hydrolytic chlorine of 0.07%, and the composition of the final product was [N=P(—O—Ph—C(CH$_3$)$_2$—Ph—O)$_{0.25}$(—O—Ph)$_{1.50}$] from a phosphorus content and a CHN elemental analysis value. The weight-average molecular weight (Mw) was 1130 in terms of polystyrene (according to GPC analysis), no clear melting point was exhibited in TG/DTA analysis, the kick-off temperature was 308° C., and a 5% weight reduction temperature was 313° C. Residual hydroxy groups were determined by acetylation, to obtain a limit of detection of not more than $1 \times 10^{-6}$ eq./g as a hydroxyl equivalent per 1 g of the sample. A phosphazene compound (B3-2) was thus obtained.

Exemplary Phenoxyphosphazene (B3-3) Having Cross-Linked Structure by 4,4-sulfonyldiphenylene (bisphenol S residue)

37.6 g (0.4 moles) of phenol and 500 ml of THF were introduced into a four-necked flask of 1 l and stirred for finely cutting and introducing 0.45 gram atoms (9.2 g) of metallic sodium while keeping an internal liquid temperature at 25° C. Thereafter stirring was continued at 65 to 72° C. for five hours until metallic sodium completely disappeared.

In parallel with the aforementioned reaction, 160.0 g (1.70 moles) of phenol and 12.5 g (0.05 moles) of bisphenol S were dissolved in 500 ml of THF in a four-necked flask of 1 l with introduction of 1.8 gram atoms (41.4 g) of metallic sodium at a temperature of not more than 25° C., and the mixture was heated to a temperature of 61° C. for one hour after completion of introduction and stirring was continued at a temperature of 61 to 68° C. for six hours thereby preparing a sodium phenolate mixed solution. This solution was dropped into 580 g of a 20% chlorobenzene solution containing dichlorophosphazene oligomer (mixture of 62% of trimer, 12% of tetramer, 11% of pentamer and hexamer, 3% of heptamer and 12% of at least octamer) under cooling/stirring at a temperature of not more than 25° C., and thereafter stirred at a temperature of 71 to 73° C. for five hours.

Then, the previously prepared sodium phenolate mixed solution was dropped and thereafter reaction was continued at a temperature of 71 to 73° C. for three hours.

After completion of reaction, the reaction product was concentrated, re-dissolved in 500 ml of chlorobenzene, washed three times with 5% NaOH and thereafter washed three times with 5% sulfuric acid, 5% baking soda water and water, and concentrated/exsiccated for obtaining 218 g of a pale-yellow waxy substance.

The cross-linked phenoxyphosphazene compound obtained in the aforementioned manner exhibited hydrolytic chlorine of not more than 0.01%, and the composition of the final product was substantially decided as [N=P(—O—Ph—SO$_2$—Ph—O)$_{0.05}$(—O—Ph)$_{1.90}$] from a phosphorus content and a CHN elemental analysis value. The weight-average molecular weight (Mw) was 1080 in terms of polystyrene, the melting point (Tm) by Tg/DTA analysis was 103° C., the kick-off temperature was 320° C., and a 5% weight reduction temperature was 334° C. Residual hydroxy groups were determined by acetylation, to obtain a limit of detection of not more than $1 \times 10^{-6}$ eq./g as a hydroxy equivalent per 1 g of the sample. A phosphazene compound (B3-3) was thus obtained.

Example 1

As shown in Table 1, 70 parts by weight of the polyimide resin (A-1), 30 parts by weight of the phosphazene compound (B3-1) and 300 parts by weight of DMAc were introduced into a reaction vessel and stirred at the room temperature to be dissolved, for obtaining a heat-resistant composition according to Example 1.

Example 2

As shown in Table 1, 70 parts by weight of the polyimide resin (A-2), 25 parts by weight of the phosphazene compound (B3-2), 20 parts by weight of DMAc, 5 parts by weight of aerogel #300, 80 parts by weight of cyclopentanone and 200 parts by weight of tetrahydrofuran were introduced into a reaction vessel and stirred at the room temperature to be dissolved, for obtaining a heat-resistant composition according to Example 2.

Example 3

As shown in Table 1, 80 parts by weight of the polyimide resin (A-3), 15 parts by weight of the phosphazene compound (B3-3), 20 parts by weight of DMAc, 2 parts by weight of triphenyl phosphate, 3 parts by weight of EP154 and 280 parts by weight of cyclopentanone were introduced into a reaction vessel and stirred at the room temperature to be dissolved, for obtaining a heat-resistant composition according to Example 3.

Example 4

As shown in Table 1, 85 parts by weight of the polyimide resin (A-4), 5 parts by weight of the phosphazene compound (B3-1), 150 parts by weight of DMAc, 5 parts by weight of aerogel #300, 5 parts by weight of EP154 (Epoxy Resin epikote 154 (Japan Epoxy Resins Co., Ltd.)) and 50 parts by weight of diglyme were introduced into a reaction vessel and stirred at the room temperature to be dissolved, for preparing a heat-resistant composition according to Example 4.

Comparative Example 1

76.8 g of trimellitic anhydride, 100.1 g of diphenylmethane diisocyanate, 0.40 g of sodium methoxide and 150 g of N-methyl-2-pyrolidone were introduced into a reaction vessel, stirred and heated to a temperature of 150° C. in about 30 minutes. Thereafter the mixture was stirred at a temperature of 150° C. for five hours, and thereafter diluted to solid concentration of 20% with addition of N-methyl-2-pyrolidone and cyclohexanone so that the solution was not whitened, and cooled to a temperature of not more than 50° C. The content of cyclohexanone was about 25% with respect to the total solvent. The obtained resin was represcipitated with methanol, to obtain inherent viscosity of 0.43 and a glass transition temperature of 280° C.

When heat resistance of this polyimide resin solution was evaluated, blistering was observed in dipping in a solder bath. The glass transition temperature of a sample employed for this evaluation was 220° C., conceivably because drying at a temperature of 165° C. for two hours under decompression was so insufficient that the solvent remained in the coating to plasticize the resin.

Comparative Example 2

A sample was prepared from only the polyimide resin (A-1) with no phosphazene compound (B3-1) in Example 1. This sample had no flame resistance corresponding to UL94V-0.

Comparative Example 3

As shown in Table 1, 70 parts by weight of the polyimide resin (A-1), 30 parts by weight of SPR-100 and 300 parts by weight of DMAc were introduced into a reaction vessel and stirred at the room temperature to be dissolved, for obtaining a heat-resistant composition according to comparative example 3.

Comparative Example 4

As shown in Table 1, 70 parts by weight of the polyimide resin (A-1), 25 parts by weight of triphenyl phosphate, 300 parts by weight of DMAc and 5 parts by weight of aerogel were introduced into a reaction vessel and stirred at the room temperature to be dissolved, for obtaining a heat-resistant composition according to comparative example 4.

Comparative Example 5

As shown in Table 1, 70 parts by weight of the polyimide resin (A-2), 25 parts by weight of aluminum hydroxide, 300 parts by weight of DMAc and 5 parts by weight of EP154 were introduced into a reaction vessel and stirred at the room temperature to be dissolved, for obtaining a heat-resistant composition according to comparative Example 5.

Comparative Example 6

As shown in Table 1, 80 parts by weight of the polyimide resin (A-4), 10 parts by weight of triphenyl phosphate, 150 parts by weight of DMAc, 5 parts by weight of aerogel #300, 5 parts by weight of EP154 and 50 parts by weight of diglyme were introduced into a reaction vessel and stirred at the room temperature to be dissolved, for obtaining a heat-resistant composition according to comparative example 6.

In the system containing not more than 30% of a low-boiling solvent in the solvent, reduction of heat resistance resulting from insufficient drying was observed (comparative example 1). Reduction of flame resistance resulting from a component imparting solvent solubility was observed in the sample soluble in a low-boiling solvent (comparative example 2).

Adhesion was reduced (comparative example 4) or the appearance after heat treatment was deteriorated (comparative example 3) when a flame retardant such as phosphoric ester was added in order to compensate for reduction of flame resistance, not to satisfy characteristics such as heat resistance, adhesiveness, solvent solubility and flame resistance.

In the heat-resistant compositions according to Examples 1 to 4, on the other hand, resin compositions satisfying all these characteristics were obtained.

Line-to-Line Insulation Resistance and Breakdown Voltage

As to each of the heat-resistant compositions according to Example 2 and comparative example 4, a sample prepared by bonding copper foil to a polyimide film was employed for evaluation of adhesiveness, and line-to-line insulation resistance and breakdown voltage were measured by a method according to JIS C5016.

The line-to-line insulation resistance and the breakdown voltage of the heat-resistant composition according to Example 2 were $1.5 \times 10^{15}$ Ω and 2.0 kV respectively, with no reduction of characteristics after a heat cycle. The line-to-line insulation resistance and the breakdown voltage of the heat-resistant composition according to comparative example 4 were $1.2 \times 10^{15}$ Ω and 1.8 kV respectively, while these characteristics were reduced to $1.0 \times 10^{15}$ Ω and 1.3 kV respectively after a heat cycle. Thus, it is understood that the heat-resistant composition according to the present invention is superior in electric characteristics and change of performance after heat treatment.

Adhesion strength, flame resistance (UL94V-0), appearance after heat treatment and adhesive strength after heat treatment were tested as to the heat-resistant compositions according to Examples 1 to 4 and comparative examples 3, 4 and 6 respectively. Table 2 shows the results.

TABLE 1

| | Example | | | | Comparative Example | | | |
|---|---|---|---|---|---|---|---|---|
| | 1 | 2 | 3 | 4 | 3 | 4 | 5 | 6 |
| polyimide resin | A-1 | A-2 | A-3 | A-4 | A-1 | A-1 | A-2 | A-4 |
| (parts by weight) | 70 | 70 | 80 | 85 | 70 | 70 | 70 | 80 |
| phosphazene compound | B3-1 | B3-2 | B3-3 | B3-1 | — | — | — | — |
| (parts by weight) | 30 | 25 | 15 | 5 | | | | |
| SPR-100 (parts by weight) | — | — | — | — | 30 | — | — | — |
| triphenyl phosphate | — | — | 2 | — | — | 25 | — | 10 |
| (parts by weight) | | | | | | | | |
| aluminum hydroxide | — | — | — | — | — | — | 25 | — |
| (parts by weight) | | | | | | | | |
| aerogel #300 | — | 5 | — | 5 | — | 5 | — | 5 |
| (parts by weight) | | | | | | | | |
| EP154 (parts by weight) | — | — | 3 | 5 | — | — | 5 | 5 |
| DMAc (parts by weight) | 300 | 20 | 20 | 150 | 300 | 300 | 300 | 150 |
| cyclopentanone | — | 80 | 280 | — | — | — | — | — |
| (parts by weight) | | | | | | | | |
| tetrahydrofuran | — | 200 | — | — | — | — | — | — |
| (parts by weight) | | | | | | | | |
| diglyme (parts by weight) | — | — | — | 50 | — | — | — | 50 |

*SPR-100: propoxycyclophosphazene (by Otsuka Chemical Co., Ltd.)

TABLE 2

|  | Example | | | Comparative Example | | |
|---|---|---|---|---|---|---|
|  | 1 | 2 | 3 | 3 | 4 | 5 |
| adhesive strength (kgf/cm) | 1.1 | 0.9 | 1.0 | 0.7 | 0.2 | 0.5 |
| flame resistance (UL94V-O) | OK | OK | OK | OK | NG* | OK |
| appearance after heat treatment | OK | OK | OK | blister | peeling | blister |
| adhesive strength after heat treatment | 1.1 | 0.8 | 1.0 | 0.3 | 0.2 | 0.1 |

*"No Good" = inferior in flame resistance.

Referring to Table 2, flame resistance was evaluated after bonding copper foil, and flame resistance was evaluated on a film prepared by applying the resin composition to Kapton by 5 μm since the copper foil was removed by etching. The resin composition was heat treated in a state stacked with copper foil and Kapton. Referring to Table 2, the term "blister" stands for a state of the resin composition part blistered like a balloon. "Adhesive strength after heat treatment" was measured after the aforementioned heat treatment.

The heat-resistant compositions according to comparative examples 3 and 6 were blistered after heat treatment. The heat-resistant composition according to comparative example 4 was inferior in flame resistance and peeled after heat treatment.

Adhesion, flame resistance (UL94V-0), appearance after heat treatment and adhesion after heat treatment were tested as to the heat-resistant compositions according to Examples 3 and 4 and comparative examples 5 and 6 respectively. Table 3 shows the results.

TABLE 3

|  | Example | | Comparative Example | |
|---|---|---|---|---|
|  | 3 | 4 | 5 | 6 |
| adhesion | 100/100 | 100/100 | 30/100 | 20/100 |
| flame resistance (UL94V-O) | OK | OK | NG* | OK |
| appearance after heat treatment | OK | OK | OK | unglossy |
| adhesion after heat treatment | 100/100 | 100/100 | 30/100 | 10/100 |

*"No Good" = inferior in flame resistance.

Referring to Table 3, flame resistance was evaluated on a film of 25 μm in thickness consisting of only each resin composition. The resin composition was heat-treated in a state stacked on an aluminum plate. The term "adhesion after heat treatment" stands for adhesion after the aforementioned heat treatment.

The heat-resistant composition according to comparative example 5 was inferior in flame resistance. The heat-resistant composition according to comparative example 6 was unglossy in the appearance after heat treatment.

Each of the heat-resistant compositions according to Examples 3 and 4 and comparative examples 5 and 6 was screen-printed on a copper foil surface of a copper-clad laminate through a screen printing plate of #150 for preparing a cover-coated copper-clad laminate. The copper-clad laminate was prepared from the heat-resistant composition according to Example 1 by the method described in the item of evaluation of adhesion.

The cover-coated copper-clad laminate was dried at a temperature of 100° C. for 10 minutes, and thereafter further dried at a temperature of 250° C. for one hour under decompression. Adhesion, flame resistance, heat resistance, appearance after heat treatment and adhesion after heat treatment were evaluated on the cover-coated copper-clad laminate obtained in the aforementioned manner. Table 4 shows the results.

The adhesion, as reported in Tables 3 and 4, was measured in accordance with ASTMD-3359. Eleven cut lines were formed, spaced by 1 mm from each other in the copper-clad laminate, and additional, orthogonally crossing eleven cut lines were formed (thus forming 100 rectangular pieces). A tape was adhered to the resulting body and thereafter peeled off. The number of the rectangular pieces that were not peeled off but left (x) of the 100 total rectangular pieces is indicated as x/100. Thus, for example, when the number of the rectangular pieces that were not peeled off but left was 30, it is indicated as 30/100.

TABLE 4

|  | Example | | Comparative Example | |
|---|---|---|---|---|
|  | 3 | 4 | 5 | 6 |
| adhesion | 100/100 | 100/100 | 40/100 | 30/100 |
| flame resistance (UL94V-O) | OK | OK | NG* | OK |
| appearance after heat treatment | OK | OK | OK | blister |
| adhesion after heat treatment | 100/100 | 100/100 | 40/100 | 20/100 |

*"No Good" = inferior in flame resistance.

The heat-resistant composition according to comparative example 5 was inferior in adhesion as well as in flame resistance. The heat-resistant composition according to comparative example 6 was inferior in adhesion, and blistered when dipped in a solder bath in evaluation of heat resistance.

Although the present invention has been described and illustrated in detail, it is clearly understood that the same is by way of illustration and example only and is not to be taken by way of limitation, the spirit and scope of the present invention being limited only by the terms of the appended claims.

The heat-resistant composition according to the present invention is excellent in electric characteristics and thermal stability, in addition to solvent solubility, heat resistance, adhesive strength and flame resistance. The heat-resistant composition according to the present invention is applicable to an adhesive, a coating material, an ink or the like.

This patent application is based on Patent Application No. 2001-34161 filed in Japan, the contents of which are hereby incorporated by reference.

What is claimed is:

1. A heat-resistant composition containing solvent-soluble polyimide resin (A), a phosphazene compound (B), and a reactive compound (C) selected from at least one of an epoxy compound, an acrylic compound, and an isocyanate compound, wherein the phosphazene compound (B) includes at least either a cyclic phenoxyphosphazene compound (B1) expressed in the following chemical formula (1):

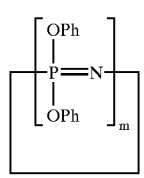

(1)

where m represents an integer of 3 to 25, and Ph represents a phenyl group, or a chain phenoxyphosphazene compound (B2) expressed in the following chemical formula (2):

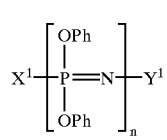

(2)

where $X^1$ represents group-$N=P(OPh)_3$ or group-$N=P(O)OPh$, $Y^1$ represents group-$P(OPh)_4$, or group-$P(O)(OPh)_2$, n represents an integer of 3 to 10,000, and Ph represents a phenyl group, or a cross-linked phenoxyphosphazene compound (B3) cross-linked by a cross-linking group including at least one of an o-phenylene group, an m-phenylene group, a p-phenylene group, and a bisphenylene group expressed in the following chemical formula (3):

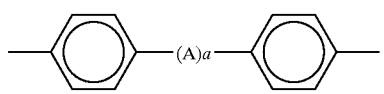

(3)

where A represents —$C(CH_3)_2$—, —$SO_2$—, —S—, or —O—, and a represents 0 or 1, with respect to the phosphazene compound including at least either the cyclic phenoxyphosphazene compound (B1) or the chain phenoxyphosphazene compound (B), so that the cross-linking group intervenes between two oxygen atoms desorbed by the phenyl group of the phosphazene compound, and the phenyl group content is 50 to 99.9% with reference to the total number of phenyl groups contained in the phosphazene compound including at least the cyclic phenoxyphosphazene compound (B 1) or the chain phenoxyphosphazene compound (B2) with no free hydroxyl groups in molecules, and wherein the polyimide resin (A) is a polyamide imide resin, and the reactive compound (C) is an epoxy compound.

2. A heat-resistant composition containing solvent-soluble polyimide resin (A), a phosphazene compound (B), and a reactive compound (C) selected from at least one of an epoxy compound, an acrylic compound, and an isocyanate compound, wherein the phosphazene compound (B) includes at least either a cyclic phenoxyphosphazene compound (B1) expressed in the following chemical formula (1):

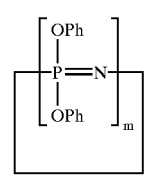

(1)

where m represents an integer of 3 to 25, and Ph represents a phenyl group, or a chain phenoxyphosphazene compound (B2) expressed in the following chemical formula (2):

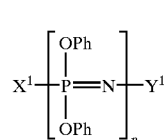

(2)

where $X^1$ represents group-$N=P(OPh)_3$ or group-$N=P(O)OPh$, $Y^1$ represents group-$P(OPh)_4$, or group-$P(O)(OPh)_2$, n represents an integer of 3 to 10.000, and Ph represents a phenyl group.

or a cross-linked phenoxyphosphazene compound (B3) cross-linked by a cross-linking group including at least one of an o-phenylene group, an m-phenylene group, a p-phenylene group, and a bisphenylene group expressed in the following chemical formula (3):

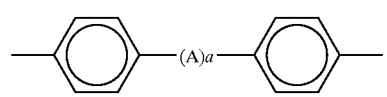

(3)

where A represents —$C(CH_3)_2$—, —$SO_2$—, —S—, or —O—, and a represents 0 or 1, with respect to the phosphazene compound including at least either the cyclic phenoxyphosphazene compound (B1) or the chain phenoxyphosphazene compound (B), so that the cross-linking group intervenes between two oxygen atoms desorbed by the phenyl group of the phosphazene compound, and the phenyl group content is 50 to 99.9% with reference to the total number of phenyl groups contained in the phosphazene compound including at least the cyclic phenoxyphosphazene compound (B1) or the chain phenoxyphosphazene compound (B2) with no free hydroxyl groups in molecules, and wherein the polyimide resin (A) is polyester imide resin, and the reactive compound (C) is an epoxy compound.

3. A heat-resistant composition containing solvent-soluble polyimide resin (A), a phosphazene compound (B), and a reactive compound (C) selected from at least one of an epoxy compound, an acrylic compound, and an isocyanate compound, wherein the phosphazene compound (B) includes at least either a cyclic phenoxyphosphazene compound (B1) expressed in the following chemical formula (1):

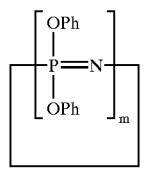

(1)

where m represents an integer of 3 to 25, and Ph represents a phenyl group, or a chain phenoxyphosphazene compound (B2) expressed in the following chemical formula (2):

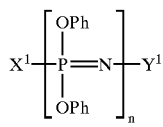

(2)

where $X^1$ represents group-N=$P(OPh)_3$ or group-N=$P(O)OPh$, $Y^1$ represents group-$P(OPh)_4$ or group-$P(O)(OPh)_2$, n represents an integer of 3 to 10,000, and Ph represents a phenyl group, or a cross-linked phenoxyphosphazene compound (B3) cross-linked by a cross-linking group including at least one of an o-phenylene group, an m-phenylene group, a p-phenylene group, and a bisphenylene group expressed in the following chemical formula (3):

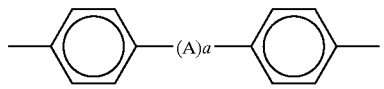

(3)

where A represents —$C(CH_3)_2$—, —$SO_2$—, —S—, or —O—, and a represents 0 or 1, with respect to the phosphazene compound including at least either the cyclic phenoxyphosphazene compound (B1) or the chain phenoxyphosphazene compound (B), so that the cross-linking group intervenes between two oxygen atoms desorbed by the phenyl group of the phosphazene compound, and the phenyl group content is 50 to 99.9% with reference to the total number of phenyl groups contained in the phosphazene compound including at least the cyclic phenoxyphosphazene compound (B1) or the chain phenoxyphosphazene compound (B2) with no free hydroxyl groups in molecules, and wherein the polyimide resin (A) is polyether imide resin, and the reactive compound (C) is an epoxy compound.

4. An adhesive for a printed wiring board employing the heat-resistant composition according to claim 1.

5. An adhesive sheet for a printed wiring board employing the heat-resistant composition according to claim 1.

6. A multilayer printed wiring board employing the heat-resistant composition according to claim 1.

7. A sealant for a printed wiring board employing the heat-resistant composition according to claim 1.

8. An insulating circuit protective film for a printed wiring board employing the heat-resistant composition according to claim 1.

9. A circuit protective agent employing the heat-resistant composition according to claim 1.

10. A cover-lay film employing the heat-resistant composition according to claim 1.

11. A cover ink employing the heat-resistant composition according to claim 1.

12. A substrate for a printed wiring board employing the heat-resistant composition according to claim 1.

13. A metal-clad laminate employing the heat-resistant composition according to claim 1.

14. A conductive paste for a printed wiring board employing the heat-resistant composition according to claim 1.

15. The heat-resistant composition according to claim 1, wherein the polyimide resin (A) comprises a solvent solubility imparting component selected from at least one of an aliphatic compound component, an alicyclic compound component, and an alkylene oxide adduct component of a bisphenol compound, soluble in a solvent containing a low-boiling solvent.

16. The heat-resistant composition according to claim 2, wherein the polyimide resin (A) comprises a solvent solubility imparting component selected from at least one of an aliphatic compound component, an alicyclic compound component, and an alkylene oxide adduct component of a bisphenol compound, soluble in a solvent containing a low-boiling solvent.

17. An adhesive for a printed wiring board employing the heat-resistant composition according to claim 2.

18. An adhesive sheet for a printed wiring board employing the heat-resistant composition according to claim 2.

19. A multilayer printed wiring board employing the heat-resistant composition according to claim 2.

20. A sealant for a printed wiring board employing the heat-resistant composition according to claim 2.

21. An insulating circuit protective film for a printed wiring board employing the heat-resistant composition according to claim 2.

22. A circuit protective agent employing the heat-resistant composition according to claim 2.

23. A cover-lay film employing the heat-resistant composition according to claim 2.

24. A cover ink employing the heat-resistant composition according to claim 2.

25. A substrate for a printed wiring board employing the heat-resistant composition according to claim 2.

26. A metal-clad laminate employing the heat-resistant composition according to claim 2.

27. A conductive paste for a printed wiring board employing the heat-resistant composition according to claim 2.

28. The heat-resistant composition according to claim 3, wherein the polyimide resin (A) comprises a solvent solubility imparting component selected from at least one of an aliphatic compound component, an alicyclic compound component, and an alkylene oxide adduct component of a bisphenol compound, soluble in a solvent containing a low-boiling solvent.

29. An adhesive for a printed wiring board employing the heat-resistant composition according to claim 3.

30. An adhesive sheet for a printed wiring board employing the heat resistant composition according to claim 3.

31. A multilayer printed wiring board employing the heat-resistant composition according to claim 3.

32. A sealant for a printed wiring board employing the heat-resistant composition according to claim 3.

33. An insulating circuit protective film for a printed wiring board employing the heat-resistant composition according to claim 3.

34. A circuit protective agent employing the heat-resistant composition according to claim 3.

35. A cover-lay film employing the heat-resistant composition according to claim 3.

36. A cover ink employing the heat-resistant composition according to claim 3.

37. A substrate for a printed wiring board employing the heat-resistant composition according to claim 3.

38. A metal-clad laminate employing the heat-resistant composition according to claim 3.

39. A conductive paste for a printed wiring board employing the heat-resistant composition according to claim 3.

* * * * *

UNITED STATES PATENT AND TRADEMARK OFFICE
CERTIFICATE OF CORRECTION

PATENT NO. : 6,743,841 B2
DATED : June 1, 2004
INVENTOR(S) : Shimizu et al.

Page 1 of 1

It is certified that error appears in the above-identified patent and that said Letters Patent is hereby corrected as shown below:

Title page,
Item [56], References Cited, OTHER PUBLICATIONS, "Abu-Shanab et al., 'Polyphosphazene Toughened PMRtype Thermosets'" should read as -- Abu-Shanab et al., "Polyphosphazene Toughened PMR-type Thermosets" --.

Column 26,
Line 26, "P(O)(OPh)$_2$, n represents an integer of 3 to 10.000, and" should read -- P(O)(OPh)$_2$, n represents an integer of 3 to 10,000, and --.
Line 27, "Ph represents a phenyl group." should read -- Ph represents a phenyl group, --.

Column 27,
Line 23, "N=P(O)OPh, Y$^1$ represents group-P(OPh)$_4$ or group-" should read -- N=P(O)OPh, Y$^1$ represents group-P(OPh)$_4$, or group- --.

Signed and Sealed this

Sixteenth Day of November, 2004

JON W. DUDAS
*Director of the United States Patent and Trademark Office*